United States Patent [19]

Kamuro et al.

[11] 4,404,654
[45] Sep. 13, 1983

[54] SEMICONDUCTOR DEVICE SYSTEM

[75] Inventors: Setsufumi Kamuro, Yamatokoriyama; Yoshifumi Masaki, Tondabayashi, both of Japan

[73] Assignee: Sharp Kabushiki Kaisha, Osaka, Japan

[21] Appl. No.: 229,508

[22] Filed: Jan. 29, 1981

[30] Foreign Application Priority Data

Jan. 29, 1980 [JP] Japan .................................. 55-9549
Jan. 31, 1980 [JP] Japan ................................. 55-11828

[51] Int. Cl.³ ........................................... G11C 11/40
[52] U.S. Cl. .................................. 365/103; 365/227; 365/235
[58] Field of Search .................... 365/94, 100, 96, 103, 365/104, 105, 227, 235

[56] References Cited

U.S. PATENT DOCUMENTS

| 3,245,051 | 4/1966 | Robb | 365/96 |
| 3,529,299 | 9/1970 | Chung et al. | 365/96 |
| 3,582,908 | 6/1971 | Koo | 365/96 |
| 3,641,516 | 2/1972 | Castrucci et al. | 365/96 |
| 3,735,367 | 5/1973 | Bennett, Jr. | 365/94 |
| 4,064,493 | 12/1977 | Davis | 365/96 |
| 4,122,547 | 10/1978 | Schroeder et al. | 365/94 |
| 4,152,627 | 5/1979 | Priel | 365/94 |
| 4,185,321 | 1/1980 | Iwahashi | 365/227 |
| 4,287,569 | 9/1981 | Fukushima | 365/96 |

Primary Examiner—Terrell W. Fears
Attorney, Agent, or Firm—Birch, Stewart, Kolasch & Birch

[57] ABSTRACT

A ratioless semiconductor read only memory circuit comprises a plurality of insulated gate field-effect transistors being arranged in the form of a matrix consisting of columns and columns, bit lines of the rows of the transistors connected in parallel a sampling transistor connected in series to each of the rows of the transistors and each of the bit lines, and a row selection circuit connected to the respective bit lines for selecting one of the bit lines. The transistors of said array corresponding to individual bits are of the enhancement type or the depletion type depending on desired logic content.

12 Claims, 8 Drawing Figures

SEMICONDUCTOR DEVICE SYSTEM

BACKGROUND OF THE INVENTION

The present invention relates to a semiconductor device and, more particularly, to a read only memory (ROM) circuit configuration.

A new type of ROM circuit system has been designed and is known as a matrix type ratioless ROM circuit and is characterized in that a plurality of insulated gate field effect transistors (FETs) with source, drain and gate electrodes are arrayed in a matrix on a single semiconductor substrate in order that the plurality of FETs of each column are serially connected through their source and drain paths to a certain output line, as referred to in Kawagoe, U.S. Pat. No. 4,145,701 issued Mar. 20, 1979, entitled "SEMICONDUCTOR DEVICE", the disclosure of which is incorporated herein by reference.

In the conventional matrix type ROM circuit system as disclosed in that patent, careful and great attention was not directed to connection of the matrix type ROM circuits with its peripheral circuit such as a selection circuit for selecting bit lines of the ROM matrix circuit so that integration density of the ROM circuit and access speed for a large memory capacity ROM circuit are insufficient.

SUMMARY OF THE INVENTION

Accordingly, it is an object of the present invention to provide an improved ratioless semiconductor circuit for eliminating the above problems.

It is another object of the present invention to provide an improved ratioless semiconductor circuit circuit comprising a plurality of FETs serially coupled to each other and a column selection circuit positioned along bit lines for the plurality of FETs.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a ratioless semiconductor read only memory circuit comprises a plurality of insulated gate field-effect transistors arranged in the form of a matrix consisting to which rows and columns, bit lines of the columns of the transistors are connected in parallel to each other, a sampling transistor connected in series to each of the columns of transistors and each of the bit lines, and a column selection circuit connected to the respective bit lines for selecting one of the bit lines.

BRIEF DESCRIPTION OF THE INVENTION

The present invention will be better understood from the detailed description given hereinbelow and the accompanying drawings which are given by way of illustration only, and thus are not limitative of the present invention wherein.

DESCRIPTION OF THE INVENTION

Figure 1:
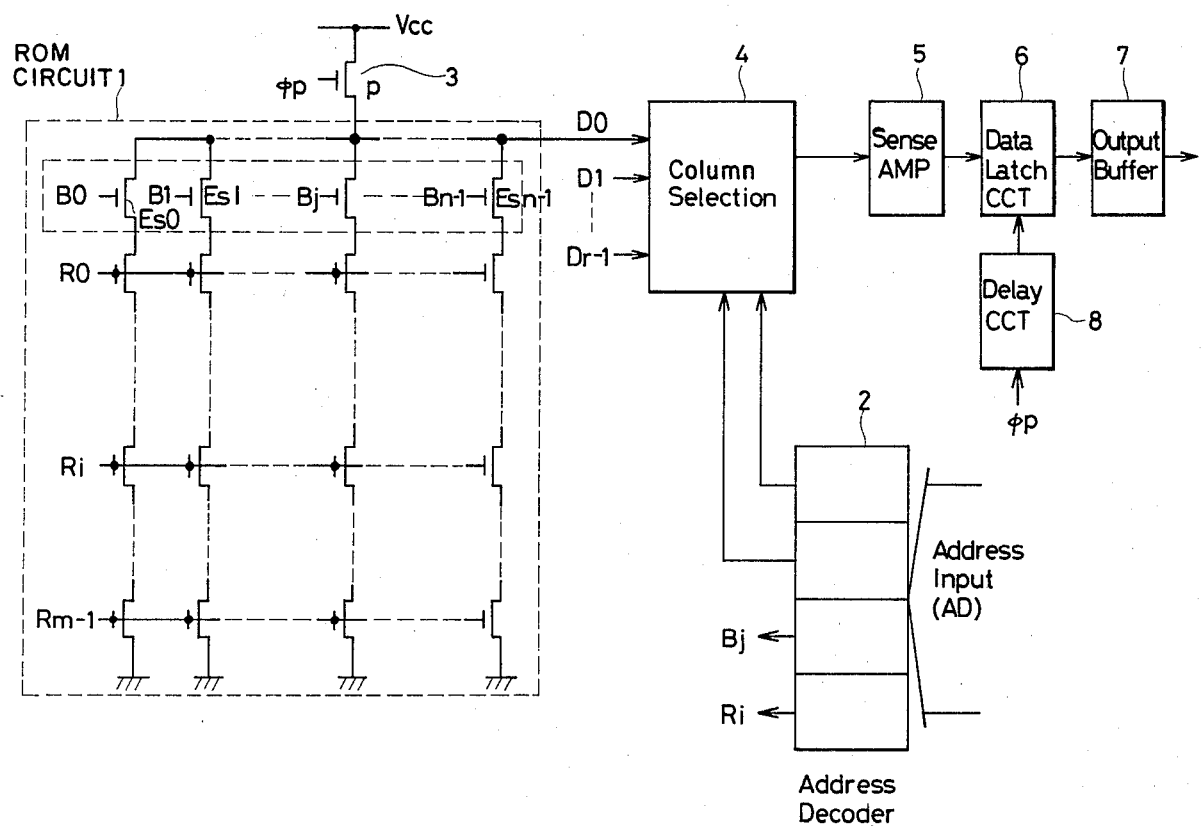
FIG. 1 shows a total block diagram of a semiconductor circuit according to the present invention.

With reference to FIG. 1, a semiconductor circuit of the present invention comprises a read only memory (ROM) circuit and an address circuit. The circuit of FIG. 1 comprises an ROM circuit 1, an address decoder 2, a P-channel MOS FET 3, a column selection circuit 4, a sense amplifier 5, a data latch circuit 6, an output buffer 7, and a delay circuit 8.

More particularly, the ROM circuit 1 includes a plurality of N-channel MOS FETs. Each column of the ROM circuit 1 includes a plurality of the N-channel MOS SETs connected in series through their source and drain paths. The address decoder 2 is provided for generating gate input signals used to select certain data, according to address signals inputted. The gate input signals are applied to the respective gates of the FETs of the ROM circuit 1. The P-channel MOS FET 3 is connected between the ROM circuit 1 and a $V_{CC}$ source line for charging one of said bit lines.

The column selection circuit 4 receives bit line data developed by the ROM circuit 1 and address signals developed by the address decoder 2 in order to select one of said bit lines $D_0$-$D_{n-1}$. The sense amplifier 5 is provided for sensing variations in voltage on one of the bit lines and control the transfer of the signals on the one of the bit lines to a data line. The data latch circuit 6 is provided for preventing the occurrence of errors in the addressing operation due to unavoidable discharge of the bit lines. The output buffer 7 is provided for reading out the output which is latched. The delay circuit 8 is connected to the data latch circuit 6 for placing the circuit 6 in an operable condition.

The type of FETs of the ROM circuit 1 is either enhancement or depletion dependent on whether data to be stored in the ROM circuit 1 in represented by "1" or "0". A certain number of FETs of each column are connected in series through their source and drain paths, the type of them being either enhancement or depletion. A certain number of columns of FETs are connected in parallel to each other to provide a single output bit line $D_0$.

In the respective columns of FETs, the source side is grounded and the drain side is series connected to a respective sampling MOS FETs of the enhancement type $ES_0, ES_1 \ldots ES_{n-1}$. The sampling MOS FETs $ES_0$-$ES_{n-1}$ are provided for selecting one of the columns of FETs. As long as these are FETs series coupled to the columns, they can function to select a desired one of the columns. They can be connected at the ground side with respect to the columns, or among the FETs.

At the side of the sampling MOS FETs as shown in FIG. 1, the FETs of each row are in parallel coupled to each other at the drain sides to provide the single bit line $D_0$. Other bit lines $D_1, D_2, \ldots D_{r-1}$ are provided in the same way.

Gate signals as represented by $R_0, R_1, \ldots R_{m-1}$ are applied to the respective gate electrodes of the FETs of the ROM circuit 1. The respective gate signals are applied to the MOS FETs of each column connected to the same bit line. Further, they are applied to the MOS FETs which are equivalent as belonging to the same row even when connected to other bit lines. Gate signals as represented by $B_0, B_1, \ldots B_{n-1}$ are applied to the respective gate electrodes of the sampling MOS FETs $ES_0, ES_1, \ldots ES_{n-1}$. Both types of gate electrodes are obtained by the address decoder 2.

In providing an actual layout of the ROM circuit 1 on the semiconductor substrate, all the columns of the FETs are connected so as to provide alignment of a single line with respect to a certain bit line. That is, with respect to the same bit line, each of the columns of the FETs is followed by the next column of the FETs to provide alignment of a single line of the rows of the FETs.

Figure 2:
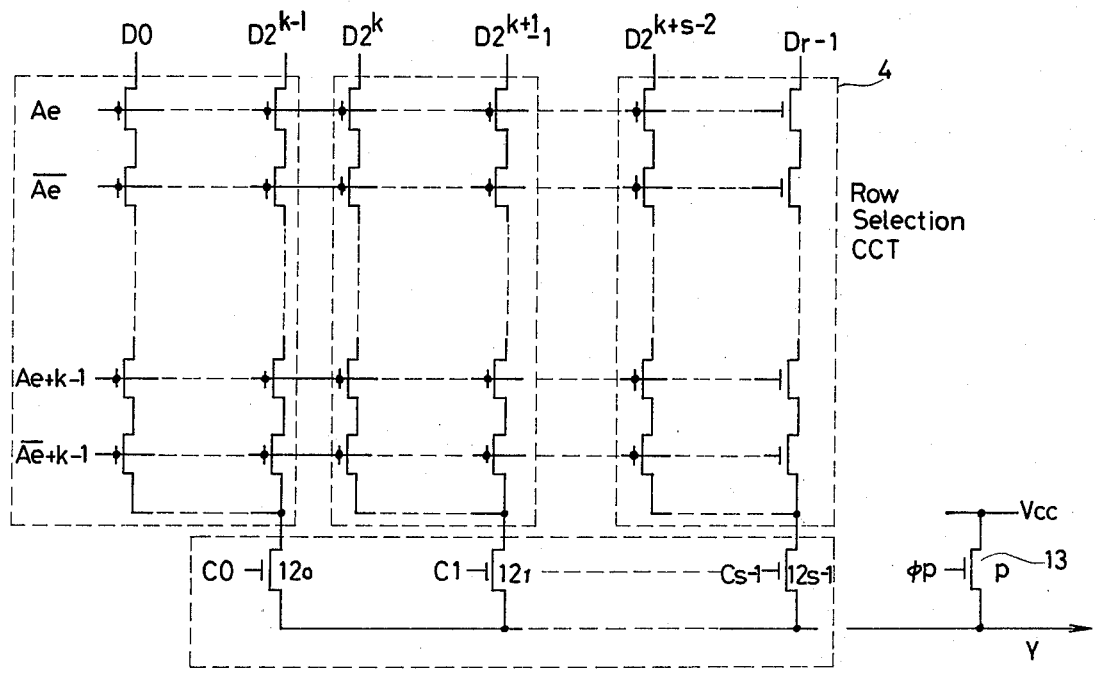
FIG. 2 shows a circuit configuration of a column selection circuit contained in the circuit of FIG. 1.

FIG. 2 shows a specific configuration of the column selection circuit 2.

Figure 3:
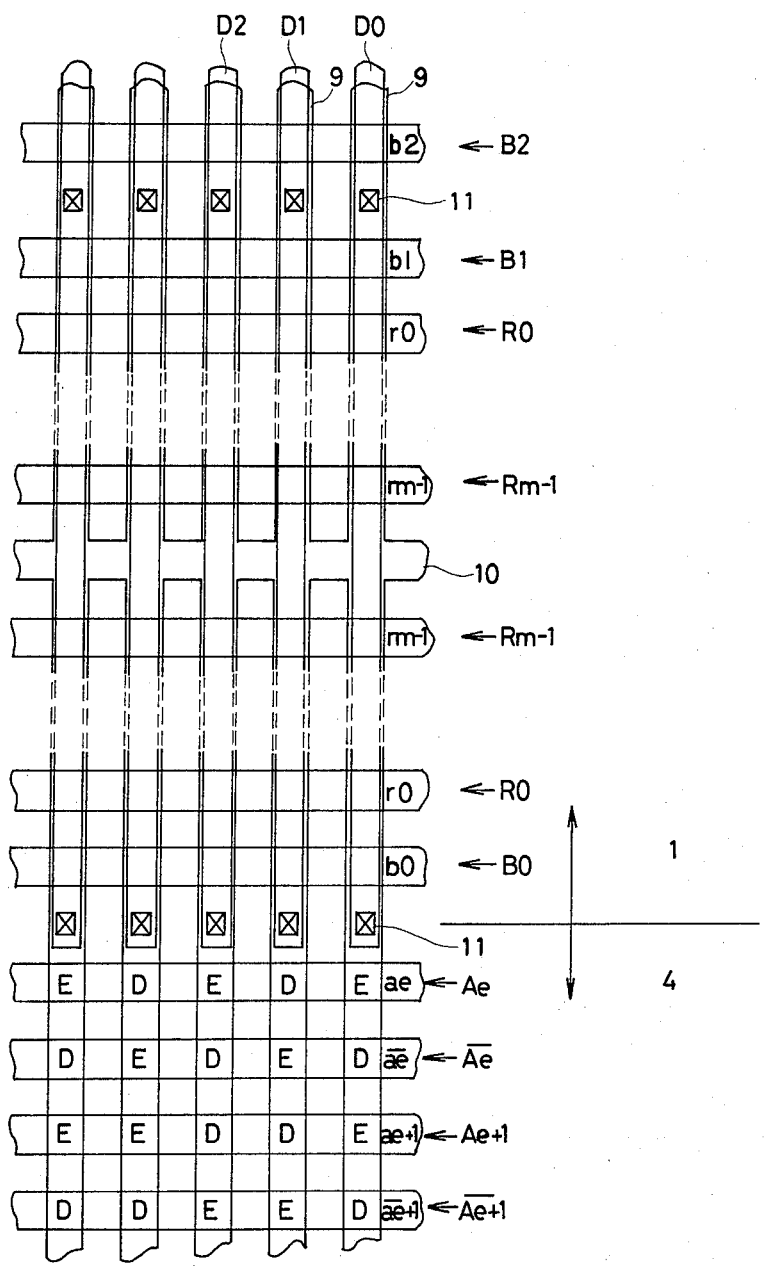
FIG. 3 shows connection of a piece of memory circuit and a piece of column selection circuit both contained in the circuit of FIG. 1.

FIG. 3 shows parts of the ROM circuit 1 and the column selection circuit 2 in a schematical representation. All of the bit lines $D_0, D_1, \ldots D_{r-1}$ are formed by metallic wirings. At the respective crossing points between the bit lines and gate electrodes $b_0$ to $b_{n-1}$ and $r_o$ to $r_{n-1}$ formed of polycrystalline silicon, there are formed the plurality of FETs and the sampling MOS FETs. On a substrate opposite to the respective bit lines, a diffusion layer 9 is formed to provide each of the MOS FETs.

The respective FETs are connected such that the respective gate signals $B_o$ to $B_{n-1}$ and $R_o$ to $R_{m-1}$ are applied to the respective FETs in such a manner that they are symmetrical to each other with respect to a grounded line 10 formed by the diffusion. The grounded line 10 is commonly utilized. The connection of the FETs of each column to the same bit line is enabled through contacts 11 to provide parallel connection.

A group of FETs extending from the respective bit lines form the column selection circuit 4. Thus, the a circuit 4 for selecting one of the bit lines is formed on the same semiconductor substrate as the ROM circuit 1 as an extension thereof to orient the same direction along the single line of the FETs of each column in the ROM circuit 1. That is, as shown in FIG. 2, the column selection circuit 4 comprises a plurality of N-channel MOS FETs connected in series between the r-bit lines and a data line Y. In this circuit 4, an enhancement type FET and a depletion type FET are paired.

The source side of one of the FETs in the column selection circuit 4 is coupled to the respective bit lines $D_0, D_1 \ldots D_{r-1}$ while the drain side of one of the the FETs is coupled to respective sources of N-channel MOS FETs $12_0$ to $12_{s-1}$ for selecting one of the bit lines, with a unit of $2^k$ dependent on the number of bit lines to be selected. The drain side of the MOS FETs $12_0$ to $12_{s-1}$ is commonly coupled to provide the data line Y. Between the $V_{CC}$ power line and the data line Y, an enhancement type P-channel MOS FET 13 is connected for pre-charging the data line Y.

Turning to FIG. 3, the column selection circuit 4 includes, in the extended direction of the respective bit lines, a number of pairs of an enhancement type N-channel MOS FET and a depletion type N-channel MOS FET. Respective gate electrodes $a_e, \bar{a}_e, \ldots a_{e+k-1}$ and $\bar{a}_{e+k-1}$ are formed, to cross the extended direction of the bit lines, by the polycrystalline silicon. Respective gate input signals $A_e, \bar{A}_e, \ldots A_{e+k-1}$, and $\bar{A}_{e+k-1}$ applied to the gate electrodes and respective gate input signals $C_0, C_1, \ldots C_{s-1}$ applied to the gate electrodes of the MOS FETs $12_0$ to $12_{s-1}$ are both developed by the address decoder 2.

As shown in FIG. 1, the address decoder 2 is constructed so that the address input signals AD applied thereto are decoded and divided into four blocks. Two blocks are used for the ROM circuit 1 while the other two blocks are used for the column selection circuit 4. After the address input signals AD are decoded, the gate input signals $B_0$ to $B_{n-1}$ and $R_0$ to $R_{m-1}$ are generated for the ROM circuit 1 while the gate input signals $C_0$ to $C_{s-1}$ and $A_e$ to $A_{e+k-1}$ are generated for the column selection circuit 4.

According to the features of the present invention, the gate input signals applied to the FETs in the ROM circuit 1 are such that a first type of gate input signals $B_0$ to $B_{n-1}$ are applied for selecting one of the columns and a second type of gate input signals $R_0$ to $R_{n-1}$ are applied for selecting one of the FETs in the selected column for address purposes. This addressing system enables compact arrangement of the FETs in this ROM circuit and, in addition, rapid access speed of the FETs in this circuit.

Further, in the column selection circuit 4, two types of address signals $C_0$ to $C_{s-1}$ and $A_e$ to $A_{e+k-1}$ are provided in order to enable compact arrangement of the FETs in this circuit 4 and, in addition, rapid access speed of them.

Figure 4:
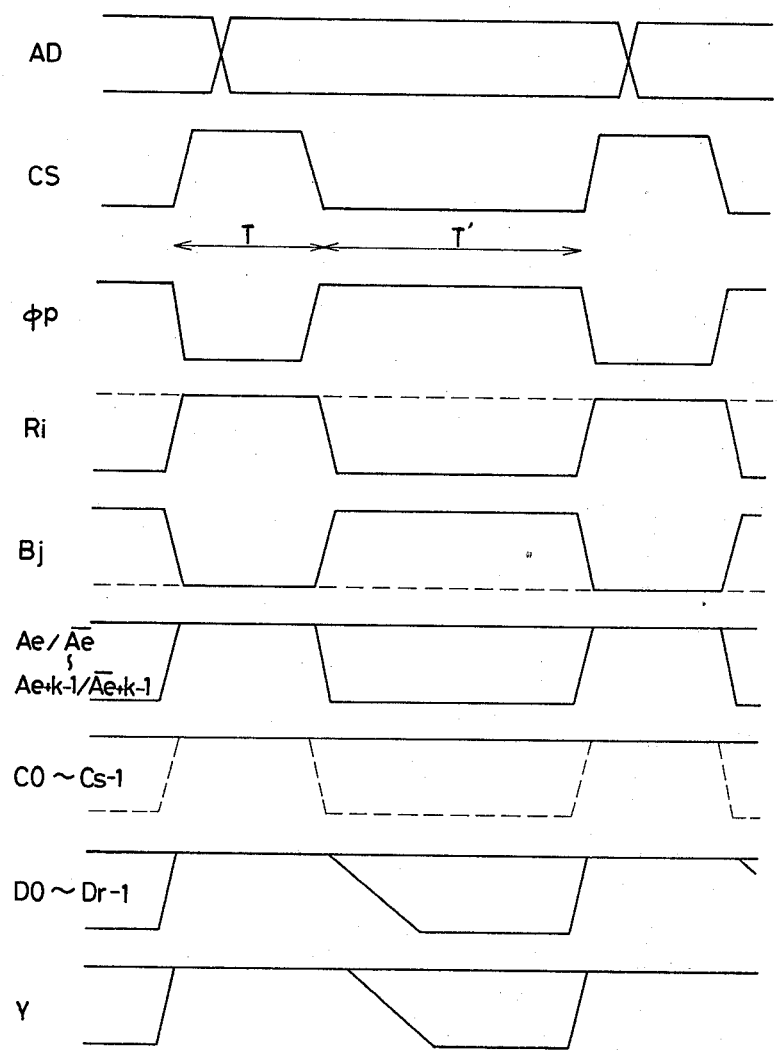
FIG. 4 shows a timing chart of signals occurring within the circuit of FIG. 1.

Address operation of the ROM circuit 1 is now described with reference to the timing chart of the signals of FIG. 4.

An internal clock pulse $\phi_p$ in synchronization with external chip selection signals CS are placed in a low voltage condition when chip selection is undesired. Therefore, the P-channel MOS FET 3 coupled to one of the bit lines of the ROM circuit 1 and the P-channel MOS FET 13 coupled to the data line Y of the column selection circuit are made conductive to precharge the data line Y and the one of the bit lines to a high voltage.

In a chip selection time T', on the other hand, the internal clock pulse $\phi_p$ cause these two P-channel MOS FETs to become nonconductive to prevent a direct current path.

Depending on the signals developed by the address decoder 2, each one of the gate input signals $R_o$ to $R_{m-1}$ and $B_o$ to $B_{n-1}$ is selected as referred to $R_i$ for the memory and $B_j$ for sampling in FIG. 1. A selected one $R_i$ of the gate input signals $R_o$ to $R_{m-1}$ is placed in the low level so that only one of the FETs of the column selected is chosen and all the remaining FETs are made conductive. When the selected one of the FETs is of the enhancement type, it is made nonconductive. When it is the depletion type, it is made conductive.

Selected $B_j$ only of the gate input signals $B_o$ to $B_{n-1}$ is placed in the high level to make one of the sampling MOS FETs $E_{so}$ to $E_{sn-1}$ conductive. A certain row of the FETs connected in series to this selected sampling FET are selected. When a selected MOS FET is the enhancement type and made nonconductive, the bit line retains a high voltage. When a selected MOS FET is the depletion type and made conductive, the bit line goes low after discharge.

The voltage on the respective bit lines is transferred to the data line Y through the column selection circuit 4 and is detected by the sense amplifier 5. In the column selection circuit 4, all the address signal $A_e$, $\overline{A}_e$ to $A_{e+k-1}$, $\overline{A}_{e+k-1}$ and $C_o$ to $C_{s-1}$ applied to the gate electrodes are placed in the high voltage in the nonselective chip state T. All the N-channel MOS FETs are kept conductive. In the chip selective state T', one of a pair of address signals is made in the low level to make the N-channel enhancement type MOS FET nonconductive.

In the case where all address signals of a low voltage are applied to the gates of depletion type MOS FETs arranged along a selected bit line, the voltage on this selected bit line is transferred to the source of a corresponding one of the N-channel MOS FETs $12_o$ to $12_{s-1}$. One of the N-channel MOS FETs $12_o$ to $12_{s-1}$ corresponding to one of the selected address signals is kept on to provide the high voltage so that one of these N-channel MOS FETs $12_o$ to $12_{s-1}$ becomes conductive. Therefore, only the voltage on the selected bit line is transferred to the data line to be detected by the sense amplifier 5.

In the case of the chip selection time T', the bit lines and the data line are separated from the power supply. In order to prevent error operation due to spontaneous discharge when the bit line is driven high, the voltage data detected by the sense amplifier 5 are latched by the data latch circuit 6 during the period set by the delay circuit 8. The output buffer 7 is provided for developing the output to thereby complete the read-out operation.

The above described circuit comprises a complementary MOS circuit in a preferred embodiment. All the FETs in the memory circuit 1 and the column selection circuit 4 are the N-channel MOS FET except for the pre-charge P-channel MOS FETs connected to the bit lines and the data line. Therefore, it may be possible to construct this circuit using FETs of only one alternative type.

Figure 5:
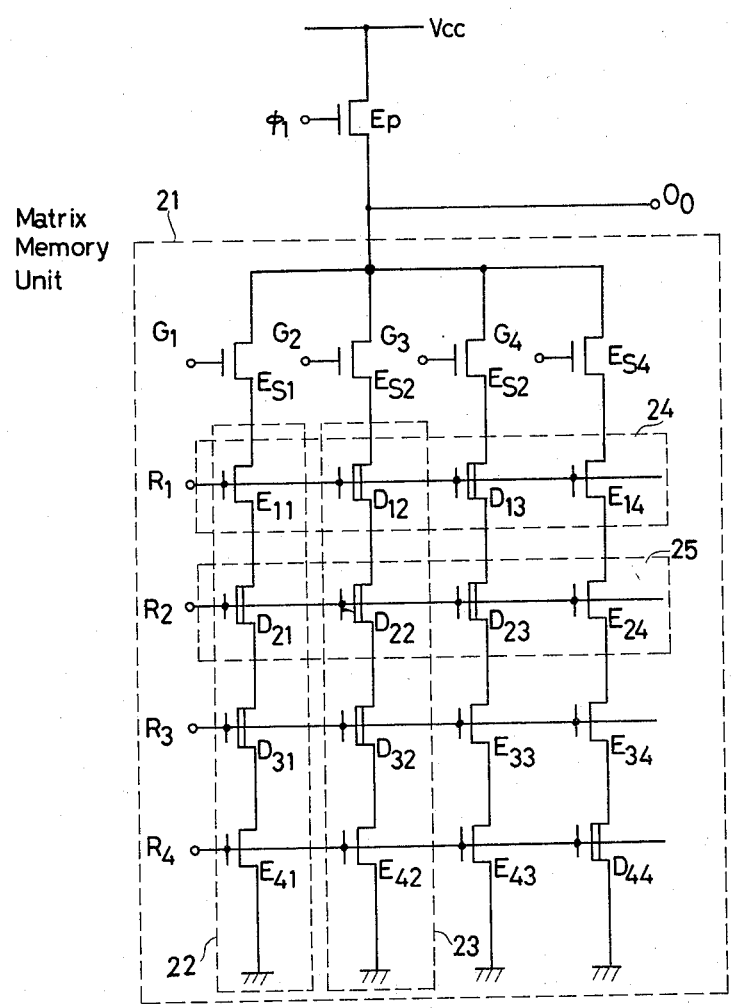
FIG. 5 shows a circuit configuration of a memory circuit according to the present invention.

Another specific embodiment of the present invention is now described. With reference to FIG. 5, another type of ROM circuit referred to as 21 comprises a number of enhancement type MOS FETs referred to as "E" and depletion type MOS FETs referred to as "D" connected in series to each other. The source sides of these FETs are grounded while the drain sides of them are connected to sampling enhancement type MOS FETs $E_{s1}$ to $E_{s4}$ whose drains are connected in common to lead to an output line $O_o$. Each column of MOS FETs contains four MOS FETs and one sampling MOS FET. Needless to say, the enhancement type or the depletion type is dependent on the kind of data to be stored.

The output line $O_o$ is coupled to the $V_{CC}$ source through a pre-charge enhancement type MOS FET $E_p$ receiving clock pulses $\phi_1$ to its gate. Then, the pre-charge of the output line $O_o$ is enabled in synchronization with the clock pulses $\phi_1$. Gate input signals $G_1$ to $G_4$ are applied to the sampling enhancement type MOS FETs $E_{s1}$ to $E_{s4}$. These gate input signals $G_1$ to $G_4$ function in two types of operations. One is to sample one of the rows of the FETs by making one of the sampling enhancement type MOS FETs $E_{s1}$ to $E_{s4}$ conductive after the pre-charge of the output line $O_o$ in synchronization with the clock pulses $\phi_1$. The other is to transfer the ROM data present in the selected column of the FETs to the output line $O_o$.

Gate input signals $R_1$ to $R_4$ are applied to the ROM MOS FETs. They are commonly applied to the MOS FETs, grouped in the same row, which are equivalent. One of the FETs belonging to the selected column is thus selected.

Figure 6:
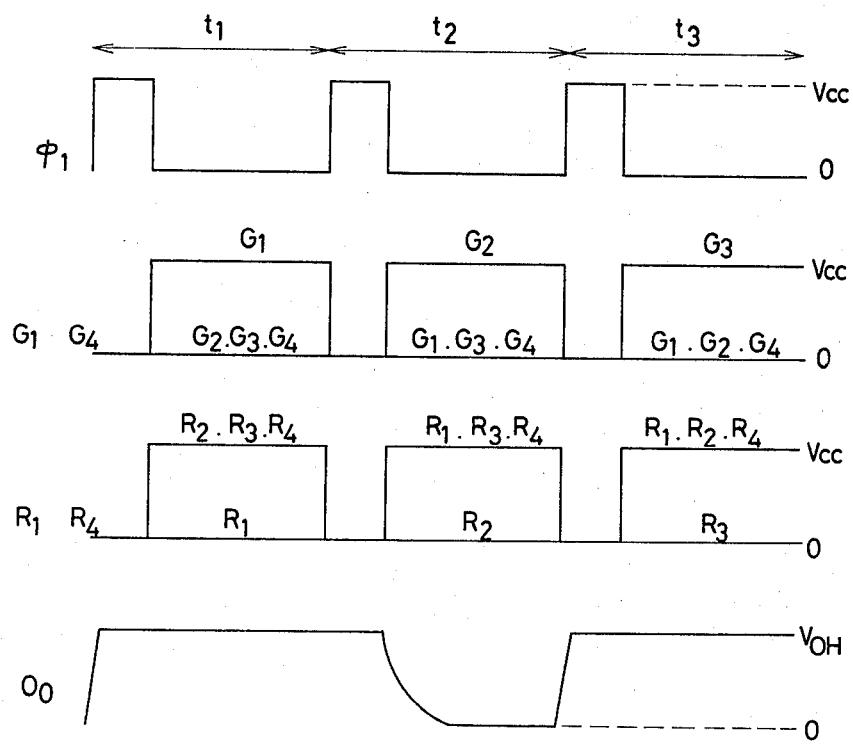
FIG. 6 shows another timing chart of signals occurring within the circuit of FIG. 5.

FIG. 6 shows a timing chart of the signals in voltage occurring within the circuit of FIG. 5. In respective timing periods $t_1$, $t_2$ and $t_3$, each pair of the gate input signals $G_1$ and $R_1$, $G_2$ and $R_2$ and $G_3$ and $R_3$ is provided to conduct operation of FIG. 5 as described below.

The pre-charge time period for the output line $O_o$ is during the period when the clock pulses $\phi_1$ are kept in the voltage of $V_{CC}$. During the pre-charge time period, all of the gate input signals $G_1$ to $G_4$ and $R_1$ to $R_4$ are kept at zero voltage so that all of the enhancement type MOS FETs in the matrix memory unit 21 are made nonconductive and the pre-charge enhancement type MOS FET Ep is only conductive to conduct the pre-charge of the output line $O_o$. This means that as capacity for the pre-charge is minimized, the time for the pre-charge and for the discharge is also shortened.

After the pre-charge by the clock pulse signals $\phi_1$ for the time period $t_1$ is terminated, the gate input signals $G_1$ are only driven to a high voltage for selecting one of the columns by making the sampling enhancement type MOS FET $E_{s1}$ conductive and placing the remaining MOS FETs $E_{s2}$ to $E_{s4}$ nonconductive. At the same time, only the gate input signals $R_1$ are kept in the zero voltage and the remaining gate input signals $R_2$ to $R_4$ are kept at a high voltage. Therefore, in a row 24 of the FETs receiving the gate input signals $R_1$, two enhancement type MOS FETs $E_{11}$ and $E_{14}$ are made nonconductive and the remaining MOS FETs are made conductive.

Since the sampling MOS FETs $E_{s1}$ and, the MOS FETs $D_{21}$, $D_{31}$, and $D_{41}$ in the same column are conductive when the MOS FET $E_{11}$ is made conductive, a current path is formed from the output line $O_o$ to the earth to enable discharge of this output line. However, as the enhancement type MOS FET $E_{11}$ is kept nonconductive, the current path is not established from this output line to the earth and thus the pre-charge is retained on this output line.

During the following time $t_2$, after the pre-charge by the clock pulse signals $\phi_1$ is terminated, the gate input signals $G_2$ are driven to a high voltage to make the sampling MOS FET $E_{s2}$ conductive and keep the remaining MOS FETs $E_{s1}$, $E_{s3}$, $E_{s4}$ nonconductive. Thus, only a column 23 of the FETs is selected. At the same time, only the gate input signals $R_2$ are placed in the zero voltage and the remaining signals $R_1$, $R_3$ and $R_4$ are kept in the high voltage. Within another row 25 of the FETs having the gate input signals $R_2$, therefore, the enhancement type MOS FET $E_{24}$ is kept nonconductive and the remaining MOS FETs are made conductive.

When the sampling MOS FET $E_{s2}$ is placed in the conductive state, the depletion type MOS FET $D_{22}$ is also placed in the conductive state, and, finally, the remaining MOS FETs $D_{12}$, $D_{32}$ and $E_{42}$ are placed in the conductive states. The charge by the pre-charge on the output line Oo by the clock pulse signals $\phi_1$ is discharged to the earth through the MOS FETs $E_{s2}$, $D_{12}$, $D_{22}$, $D_{32}$ and $E_{42}$.

Thus, within the matrix type MOS circuit 21 wherein the ROM data are identified and discriminated dependent on either the enhancement type or the depletion type, each column of the FETs is selected by the input signals of the gate input signals applied to one of the enhancement type MOS FETs $E_{s1}$ to $E_{s4}$, the signals being in synchronization with clock pulse signals $\phi_1$ provided for the pre-charge purposes. Selection of each column and the discharge of the output line are both enabled advantageously by using a single enhancement type MOS FET and without any additional sampling-only-oriented MOS FET.

Further, since all the enhancement MOS FETs $E_{s1}$ to $E_{s4}$ are connected at the output side of the MOS FETs connected in series to each other, the precharge capacitance is minimized. In combination with one of the features of the present invention, namely, regarding the column selection and the discharge of the output line, access time and cycle time are both advantageously shortened. Furthermore, the signals $\phi_1$, $R_1$ to $R_4$ and $G_1$ to $G_4$ are provided at the timing as shown in FIG. 6 so that direct current paths from source to earth are inhibited to provide low power consumption.

In the ROM circuit as sown in FIG. 5, an increase in memory capacity per one of the output lines becomes possible by increasing the number of rows of the FETs or increasing the number of columns of the FETs. Each of these methods can be adopted dependent on the desired access time and degree of integration. In order to provide a large degree of capacity in the ROM circuit, the number of the output lines can increase.

Figure 7:
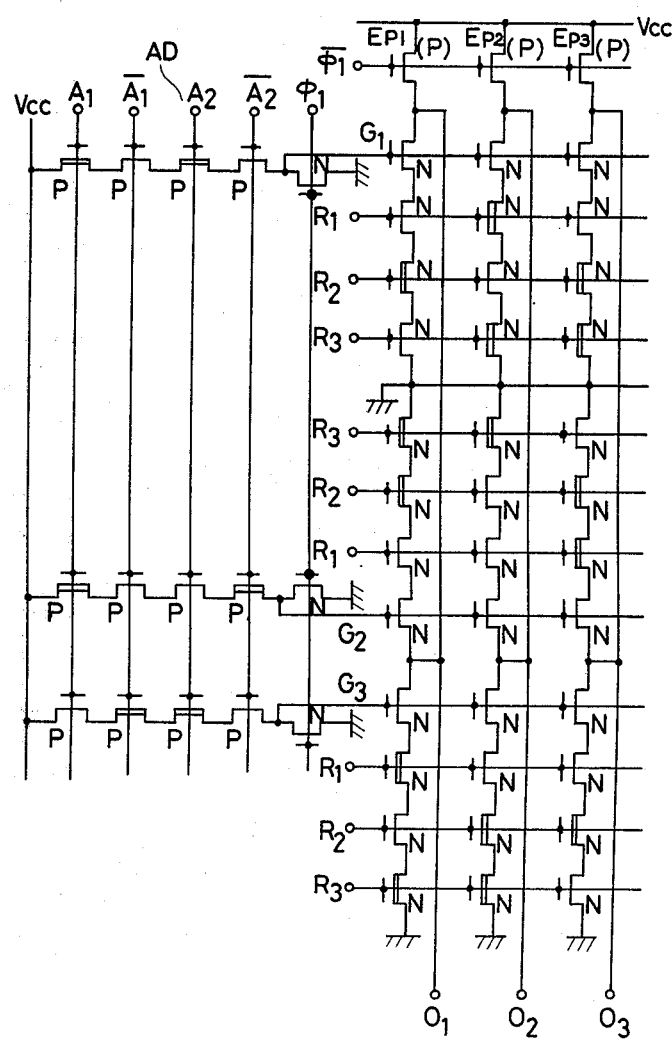
FIG. 7 shows a specific circuit configuration of the circuit of the present invention.

FIG. 7 shows an extensive embodiment of the present invention in which memory capacity is increased by arranging the ROM circuit in a mixture of parallel and serial connection. In this circuit, three output lines carrying 9 bits are connected. Columns of the FETs connected in parallel to each other in FIG. 5 are replaced by a line of FETs with a unit of each of output lines $O_1$, $O_2$ and $O_3$. Without any remarkable sacrifice in access time, the memory capacity of the ROM circuit is greatly increased. In the case of providing the ROM circuit connected in line as shown in FIG. 7, silicon gate processing can be utilized for supplying metallic wirings as the output lines.

The ROM circuit of FIG. 7 is constructed by a complementary MOS FET scheme in which the pre-charge enhancement type MOS FETs $E_{p1}$, $E_{p2}$ and $E_{p3}$ are formed of the P-channel type and the matrix memory MOS FETs are formed of the N-channel type. The clock pulse signals $\phi_1$, the gate input signals $G_1$ to $G_3$ and $R_1$ to $R_3$ are applied for enabling access to the ROM data in the similar manner as described above. The sampling gate input signals $G_1$ to $G_3$ are developed by the address decoder AD so that, according to the complementary MOS FET scheme, the address decoder AD can be constructed by a P-channel MOS FET scheme so as to minimize the area occupied by the decoder.

Figure 8:
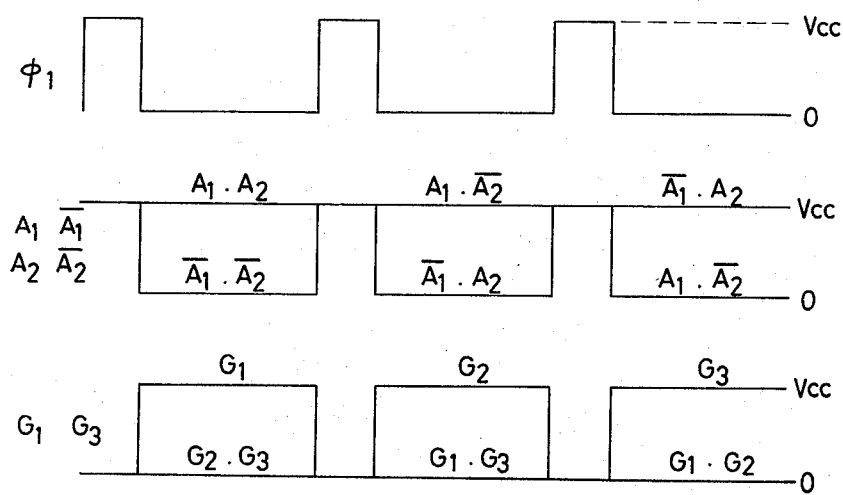
FIG. 8 shows a specific timing chart of signals occurring within the circuit of FIG. 7.

FIG. 8 shows another timing chart of signals occurring within the address decoder AD.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor read only memory circuit comprising:
    a row by column memory array having field effect transistors serially interconnected source to drain in columns, transistors in corresponding positions of respective columns having their bases interconnected to form address lines, each said transistor representing a bit in memory and being of an enhancement type to represent a first binary logic state and being of a depletion type to represent a second binary logic state;
    output means for receiving information from each of said columns;
    first means for selectively sampling desired ones of said columns; and
    second means for selectively sampling desired ones of said address lines;
    said first and second means collectively defining a desired bit in memory;
    the logic state of said transistor representing said bit being determined by whether said transistor is said enhancement type or depletion type.

2. The circuit of claim 1 wherein said transistors are insulated gate field effect transistors.

3. The circuit of claim 1 wherein selection of one of said columns causes each transistor in said column not sampled by said second means to become conductive.

4. The circuit of claim 2 wherein said first means includes an enhancement mode insulated gate field effect transistor connected in series with each said column.

5. The circuit of claim 2 further comprising means for pre-charging said output line.

6. The circuit of claim 4 wherein said means for pre-charging includes at least one enhancement mode insulated gate field effect transistor.

7. The circuit of claim 5 wherein said enhancement mode insulated gate field effect transistor is formed as a P-channel type.

8. The circuit of claim 3 wherein said enhancement mode insulated gate field effect transistors included in said first means are formed as N-channel types.

9. The circuit of claim 3 further comprising address decoder means for generating gate signals applied to said address lines.

10. The circuit of claim 8 wherein said address decoder means is formed of P-channel insulated gate field effect transistors.

11. The circuit of claim 1 wherein said first means for selectively sampling includes a field effect transistor connected in series with each said column;
    a bit line connected to the gate of each field effect transistor included in said first means; and
    column selection means connected to said bit lines for selecting a desired column.

12. The circuit of claim 10 further comprising address decoder means connected to said first and second means for developing address signals for application to said column selection means and said second means.

* * * * *